United States Patent
Lin et al.

(10) Patent No.: US 11,776,821 B2
(45) Date of Patent: *Oct. 3, 2023

(54) MICRO-ELECTRONIC PACKAGE WITH SUBSTRATE PROTRUSION TO FACILITATE DISPENSE OF UNDERFILL BETWEEN A NARROW DIE-TO-DIE GAP

(71) Applicant: Intel Corporation, Santa Clara, CA (US)

(72) Inventors: Ziyin Lin, Chandler, AZ (US); Vipul Mehta, Chandler, AZ (US); Edvin Cetegen, Chandler, AZ (US); Yuying Wei, Chandler, AZ (US); Sushrutha Gujjula, Chandler, AZ (US); Nisha Ananthakrishnan, Chandler, AZ (US); Shan Zhong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/669,288

(22) Filed: Feb. 10, 2022

(65) Prior Publication Data

US 2022/0165585 A1 May 26, 2022

Related U.S. Application Data

(63) Continuation of application No. 15/942,109, filed on Mar. 30, 2018, now Pat. No. 11,282,717.

(51) Int. Cl.
*H01L 21/56* (2006.01)
*H01L 21/67* (2006.01)
*H01L 23/00* (2006.01)
*H01L 23/31* (2006.01)
*H01L 23/13* (2006.01)

(52) U.S. Cl.
CPC ...... *H01L 21/563* (2013.01); *H01L 21/67126* (2013.01); *H01L 23/13* (2013.01); *H01L 23/3157* (2013.01); *H01L 23/564* (2013.01); *H05K 2201/09045* (2013.01)

(58) Field of Classification Search
CPC . H01L 21/563; H01L 23/3157; H05K 1/0272; H05K 2201/09045; H05K 2201/09054
See application file for complete search history.

(56) References Cited

U.S. PATENT DOCUMENTS

| | | |
|---|---|---|
| 5,071,363 A | 12/1991 | Reylek |
| 5,218,234 A | 6/1993 | Thompson |
| 5,612,576 A | 3/1997 | Wilson |
| 5,647,123 A | 7/1997 | Greenwood |
| 5,697,148 A | 12/1997 | Lance, Jr. |

(Continued)

*Primary Examiner* — Victoria K. Hall
(74) *Attorney, Agent, or Firm* — Schwabe, Williamson & Wyatt P.C.

(57) ABSTRACT

A substrate protrusion is described. The substrate protrusion includes a top portion that extends in a first direction toward a gap between the first die and the second die and in a second direction parallel to the gap between the first die and the second die. The substrate protrusion also includes a base portion that is coupled to a substrate that extends underneath the first die and the second die. An encapsulant is over the protrusion of the substrate, the encapsulant extending beneath the first die, and the encapsulant extending beneath the second die.

19 Claims, 5 Drawing Sheets

(56) References Cited

U.S. PATENT DOCUMENTS

| | | | |
|---|---|---|---|
| 5,710,071 A | 1/1998 | Beddingfield | |
| 5,766,982 A | 6/1998 | Akram | |
| 5,920,126 A | 7/1999 | Sahara | |
| 5,981,312 A | 11/1999 | Farquhar | |
| 6,038,136 A | 3/2000 | Weber | |
| 6,048,656 A | 4/2000 | Akram | |
| 6,081,997 A | 7/2000 | Chia | |
| 6,094,354 A | 7/2000 | Nakajoh | |
| 6,157,086 A | 12/2000 | Weber | |
| 6,310,780 B1 | 10/2001 | Tamura | |
| 6,324,069 B1 | 11/2001 | Weber | |
| 6,445,074 B1 | 9/2002 | Galuschki | |
| 6,556,030 B1 | 4/2003 | Akram | |
| 6,653,743 B2 | 11/2003 | Galuschki | |
| 6,680,435 B1 | 1/2004 | Ogawa | |
| 6,977,686 B2 | 12/2005 | Shinomiya | |
| 7,033,864 B2 | 4/2006 | Libres | |
| 7,190,073 B2 | 3/2007 | Kwon | |
| 7,288,725 B2 | 10/2007 | Takeuchi | |
| 7,375,433 B2 | 5/2008 | Kuramochi | |
| 7,400,048 B2 | 7/2008 | Choi | |
| 7,759,802 B2 | 7/2010 | Miyazaki | |
| 7,875,503 B2 | 1/2011 | Gokhale | |
| 8,143,096 B2 | 3/2012 | Park | |
| 8,169,083 B2 | 5/2012 | Igarashi | |
| 8,378,472 B2 | 2/2013 | Matsuno | |
| 8,378,482 B2 | 2/2013 | Ozawa | |
| 8,796,075 B2 | 8/2014 | Babiarz | |
| 9,142,526 B2 | 9/2015 | Lin | |
| 9,312,193 B2 | 4/2016 | Chen | |
| 9,314,882 B2 | 4/2016 | Babiarz | |
| 9,412,918 B2 | 8/2016 | Yamada | |
| 9,583,367 B2 | 2/2017 | Huang | |
| 9,640,505 B2 | 5/2017 | Lin | |
| 9,659,893 B2 | 5/2017 | Lin | |
| 9,691,676 B2 | 6/2017 | Kodama | |
| 9,818,700 B2 | 11/2017 | Chen | |
| 10,020,236 B2 | 7/2018 | Wang | |
| 10,026,667 B2 | 7/2018 | Nonogawa | |
| 10,497,675 B2 | 12/2019 | Kwak | |
| 10,515,865 B2 | 12/2019 | Chen | |
| 10,522,477 B2 | 12/2019 | Chen | |
| 10,879,208 B2 | 12/2020 | Jung | |
| 11,217,555 B2 * | 1/2022 | Huang | H01L 23/5383 |
| 11,282,717 B2 * | 3/2022 | Lin | H01L 23/3157 |
| 2002/0195703 A1 | 12/2002 | Kameda | |
| 2005/0285277 A1 | 12/2005 | Kwon | |
| 2006/0273461 A1 | 12/2006 | Otsuka | |
| 2007/0096337 A1 | 5/2007 | Choi | |
| 2007/0126110 A1 | 6/2007 | Kwon | |
| 2007/0269930 A1 | 11/2007 | Gupta | |
| 2008/0017983 A1 | 1/2008 | Tzeng | |
| 2008/0153206 A1 | 6/2008 | Stoneham | |
| 2008/0203564 A1 | 8/2008 | Matayoshi | |
| 2008/0251287 A1 | 10/2008 | Shiraishi | |
| 2009/0065919 A1 | 3/2009 | Jang | |
| 2009/0123702 A1 | 5/2009 | Yoshizawa | |
| 2009/0250258 A1 | 10/2009 | Warigaya | |
| 2009/0294978 A1 | 12/2009 | Ota | |
| 2010/0033647 A1 | 2/2010 | Okita | |
| 2010/0132982 A1 | 6/2010 | Cho | |
| 2010/0139962 A1 | 6/2010 | Kaneko | |
| 2010/0327421 A1 | 12/2010 | Luan | |
| 2011/0074015 A1 | 3/2011 | Suzuki | |
| 2012/0119346 A1 | 5/2012 | Im | |
| 2013/0026655 A1 | 1/2013 | Lee | |
| 2013/0220688 A1 | 8/2013 | Kubo | |
| 2014/0027920 A1 | 1/2014 | Kodama | |
| 2014/0131877 A1 | 5/2014 | Chen | |
| 2014/0178644 A1 | 6/2014 | Nystrom | |
| 2014/0305686 A1 | 10/2014 | Kitajima | |
| 2014/0361437 A1 | 12/2014 | Seo | |
| 2017/0079135 A1 | 3/2017 | Hu | |
| 2018/0033926 A1 | 2/2018 | Nonogawa | |
| 2018/0358237 A1 | 12/2018 | Lu | |
| 2019/0103375 A1 * | 4/2019 | Huang | H01L 24/16 |
| 2019/0320531 A1 | 10/2019 | Yasuda | |

* cited by examiner

FIG. 1

PRIOR ART

MICRO-ELECTRONIC PACKAGE WITH SUBSTRATE PROTRUSION TO FACILITATE DISPENSE OF UNDERFILL BETWEEN A NARROW DIE-TO-DIE GAP

CROSS-REFERENCE TO RELATED APPLICATION

This application is a Continuation of U.S. patent application Ser. No. 15/942,109, filed on Mar. 30, 2018, the entire contents of which are hereby incorporated by reference herein.

TECHNICAL FIELD

Embodiments of the disclosure relate to semiconductor structures and packaging and, more particularly to microelectronic packages with a substrate protrusion to facilitate the dispensing of capillary underfill material between a narrow die-to-die gap.

BACKGROUND

Addressing the continuous space demands related to the integration of electronic packages results in smaller and smaller keep-out-zones (KOZs). A KOZ is the real estate or space on an electronic package that epoxy material is allowed to wet. If the epoxy material wets the electronic package outside of the KOZ, it is considered to be a KOZ violation. KOZ constraints present challenges for conventional capillary underfill (CUF) processes. In particular, the very small KOZs that can be involved, can present challenges such as the insufficiency of space for CUF dispensing.

To address KOZ challenges, pre-applied materials, such as nonconductive paste (NCP) and nonconductive film (NCF), have been proposed. An advantage provided by pre-applied materials is that no CUF dispensing is required. However, although such materials have been used in small factor packages with very low numbers of bumps, they have not been used in medium to large die, full bump array, flip chip packages. A reason that they have not been used in such packages is that pre-applied materials have challenges meeting chip attach yield and reliability requirements. This is mainly due to the conflicting requirements for high chip attach yield and high chip reliability. In particular, high chip attach yield requires lower filler loading, and high chip reliability requires higher filler loading.

DESCRIPTION OF THE EMBODIMENTS

A micro-electronic package with substrate protrusion to facilitate dispense of underfill between a narrow die-to-die gap. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Figure 1:
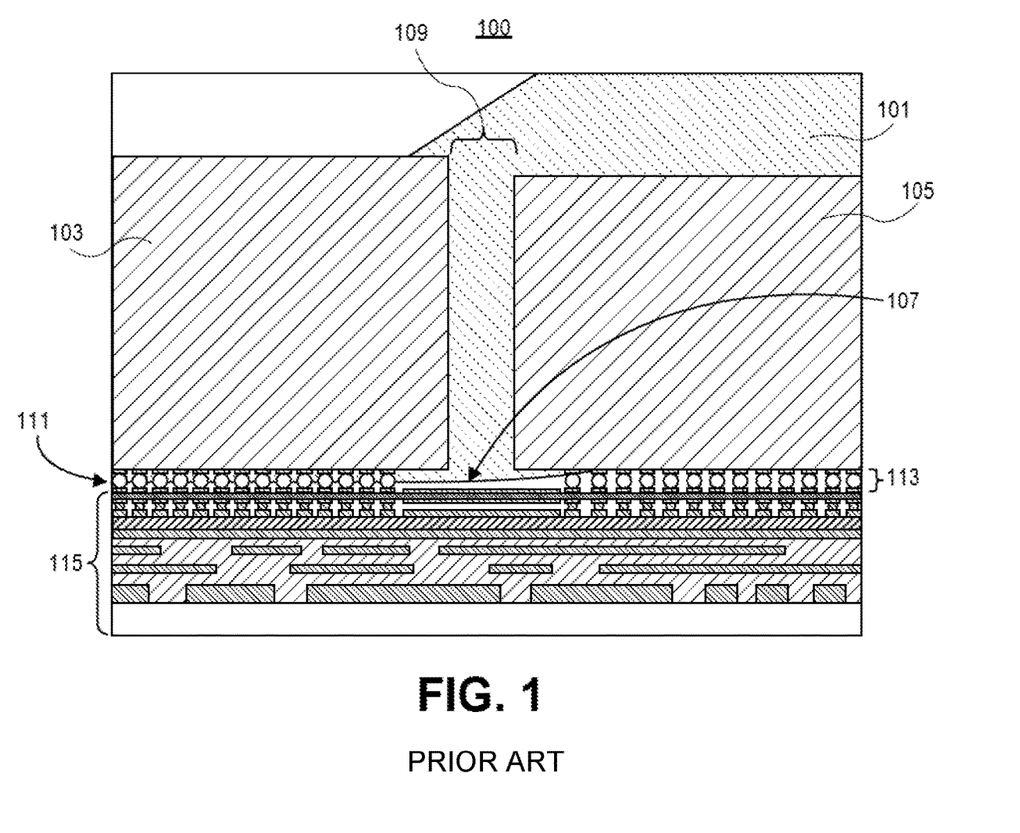
FIG. 1 is an illustration of a cross-sectional view of a capillary underfill (CUF) dispensing approach for encapsulating the bottom side of adjacent dies with a narrow die-to-die gap.

FIG. 1 is an illustration of a cross-sectional view 100 of the result of a capillary underfill (CUF) dispensing approach for encapsulating the bottom side of adjacent dies with a narrow die-to-die gap (the gap defined by the space between the adjacent dies). Shown in FIG. 1 is capillary underfill (CUF) encapsulant material 101, first die 103, second die 105, encapsulant flow stopping point 107, die-to-die gap 109, bottom side electrical connectors 111, underfill region 113, and package substrate 115. FIG. 1 illustrates a drawback of a conventional capillary underfill approach for encapsulating the bottom side of adjacent dies with a narrow die-to-die gap. Referring to FIG. 1, as part of the approach, the CUF encapsulant material 101 is dispensed into the die-to-die gap 109 between the first die 103 and the second die 105. The CUF encapsulant material 101 is dispensed to flow downward (vertically), within the die-to-die gap 109, between the first die 103 and the second die 105. Because of insufficient space for CUF dispensing and insufficient capillary pressure, physical forces acting upon the CUF encapsulant material 101 can cause a stopping point of encapsulant flow 107 to be reached before bottom side electrical connectors 111 are encapsulated. In the FIG. 1 example, the stopping point of the encapsulant flow 107 occurs near the bottom of the die-to-die gap 109.

Conventional CUF approaches such as that illustrated in FIG. 1 are not suitable for the dispense of underfill material into narrow die-to-die gaps. The technical challenges encountered using such approaches can include but are not limited to: (1) stoppages of the flow of the CUF encapsulant material 101 at the die-to-die gap (instead of filling the underfill region 113) and (2) the depositing of significant amounts of the CUF encapsulant material 101 onto one or both of the adjacent dies which can cause down-stream assembly problems.

The CUF encapsulant material 101 is dispensed in fluid form into the die-to-die gap 109 in order to fill the space underneath the first die 103 and the second die 105 such that the bottom side electrical connectors 111 that are located in the underfill region 113 are encapsulated. In particular, the CUF encapsulant 101 encapsulates the bottom side electrical connectors 111 positioned between the bottom side surfaces of the first die 103 and the second die 105 and the package substrate 115. The CUF encapsulant material 101 can be dispensed using an automated/computerized dispense platform. In embodiments of the disclosure described herein, such as with reference to FIGS. 4-6, the CUF encapsulant material 101 can be dispensed in any suitable manner of dispensing CUF encapsulant material. The CUF encapsulant material 101 can include but are not limited to epoxy materials. In embodiments of the disclosure described herein, such as with reference to FIGS. 4-6, the CUF encapsulant material can be any material that is suitable for encapsulating the underfill region 113. The advantages provided by the encapsulation of the underfill region can include but are not limited to protecting the bottom side electrical connectors 111 from cracking and providing shock resistance.

The first die 103 and the second die 105 are semiconductor dies that are positioned side by side on the package substrate 115 and are coupled to the package substrate 115 through bottom side electrical connectors 111. The die-to-die gap 109 that separates the first die 103 and the second die 105 can be very narrow. In some cases the die-to-die gap can be as narrow as 100 um. In other cases the die-to-die gap can be narrower. Conventional CUF dispense processes are not compatible with adjacent die arrangements that include such narrow die-to-die gaps. An unsatisfactory underfill process can result in the underfill material stopping in the die-to-die gap (see FIG. 1). In addition, an unsatisfactory underfill process can result in an "epoxy on die" condition that can negatively impact processing operations (see FIG. 1 at top of die).

Bottom side electrical connectors 111 couple the first die 103 and the second die 105 with the package substrate 115. Bottom side electrical connectors 111 can include solder bumps and attached pads (see FIG. 1). The solder bumps can be attached to pads of the package substrate 115 or die pads of a semiconductor die.

The package substrate 115 mounts the first die 103 and the second die 105. The package substrate 115 is coupled to the first die 103 and the second die 105 through the bottom side electrical connectors 111. The package substrate 115 is also used to electrically couple the first die 103 and the second die 105 to other components or devices of an electronic system. For example, different types of passive elements and/or integrated circuits. The package substrate 115 can include a multilayered structure (see FIG. 1). The mulitlayered wiring substrate structure can use vias to provide interlayer connectivity.

Figure 2:
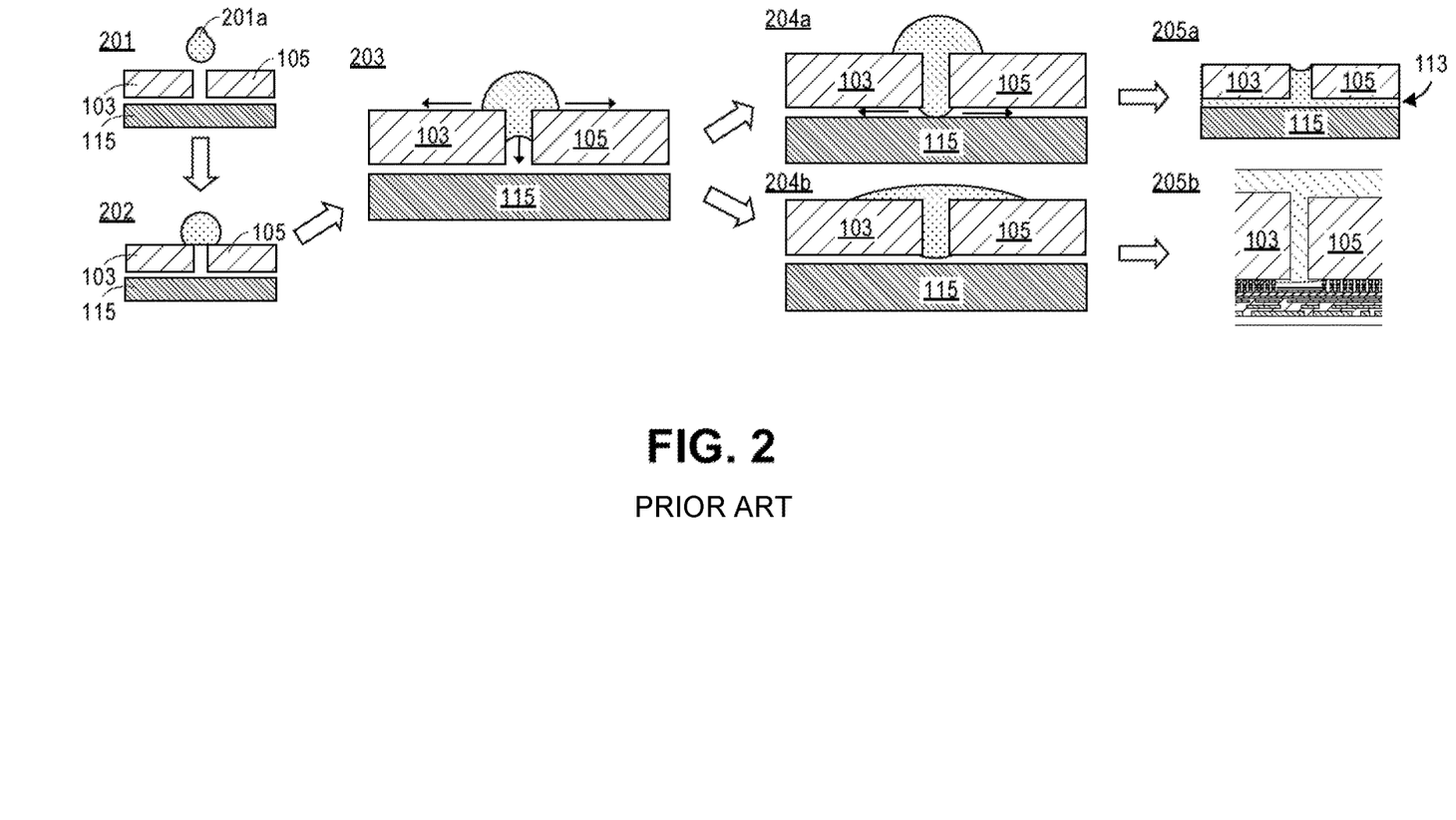
FIG. 2 is an illustration of a cross-sectional view of the CUF dispense process associated with the approach of FIG. 1.

FIG. 2 is an illustration of cross-sectional views of the CUF die-to-die encapsulant dispensing and flow process associated with the approach of FIG. 1. The packaging processes involved can include but are not limited to flip chip or ball grid array (BGA). Typically, the encapsulation is intended to be completed free from air entrapment.

Referring to FIG. 2, at 201, CUF encapsulant droplets 201a are dispensed toward the die-to-die gap that is located between the first die 103 and the second die 105. The droplets are intended to encapsulate the electrical connectors (e.g., 111 in FIG. 1) in the underfill region 113 that is located between the bottom side surfaces of the first die 103 and the second die 105 and the top surface of the package substrate 115.

At 202, the CUF encapsulant droplets dispensed at 201 contact the back side surfaces of the first die 103 and the second die 105 and remain for a period of a few milliseconds. Referring to FIG. 2, the dispensed droplets cover the opening of the die-to-die gap between the first die 103 and the second die 105.

At 203, the CUF encapsulant flows in two competing directions, horizontally on the back side surfaces of the first die 103 and the second die 105, and vertically in the gap between the first die 103 and the second die 105. The horizontal and vertical flows occur simultaneously. Based on these flows two scenarios can result. The scenario that results depends upon properties of the encapsulant material (see discussion made with reference to FIG. 6). The two scenarios are described with reference to operations 204a and 204b which are illustrated in FIG. 2.

Figure 3:
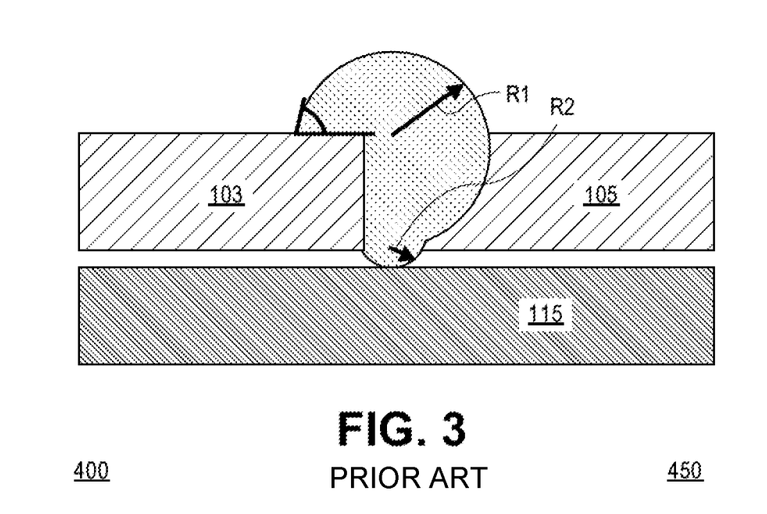
FIG. 3 is an illustration of a cross-sectional view of a package that shows the relationship between the radius of CUF droplets that extend from the backside surfaces of a first and a second die, and the radius of a CUF portion that extends from the bottom of the space between the first and the second die.

At 204a, the CUF encapsulant flow into the die-to-die gap is the dominant flow direction, whereas the CUF encapsulant flow on the back side surfaces of the first die 103 and the second die 105 is minimal. This flow pattern results in a high contact angle of CUF encapsulant on the back side surfaces of the first die 103 and the second die 105. Due to hydrostatic pressure balance, the radius of the CUF encapsulant droplets extending from the back side surfaces of the first die 103 and the second die 105, and the radius of the CUF encapsulant portion extending from the bottom of the die-to-die gap between the first die 103 and the second die 105, are directly related in terms of their relative magnitudes which are labelled R1 and R2 in FIG. 3. For example, a large R1, extending from the back side surfaces of the first die 103 and the second die 105, can cause a large R2, extending from the bottom of the die-to-die gap between the first die 103 and the second die 105, to be generated. Consequently, based on the large R1, the hydrostatic pressure balance at 204a is sufficient to cause the CUF encapsulant to contact the package substrate 115. When the CUF encapsulant makes contact with the package substrate 115, the capillary force drives the CUF encapsulant flow into the underfill region 113, as shown in 205a.

At 204b, in contrast to the flow pattern described at 204a, the CUF encapsulant flow on the back side surfaces of the first die 103 and the second die 105 is the dominant flow direction. Moreover, the CUF encapsulant flow in the die-to-die gap between the first die 103 and the second die 105 is correspondingly slow. This causes a low contact angle of the CUF encapsulant on the back side of surfaces of the first die 103 and the second die 105. As a result, R1 and R2 are both small and the CUF encapsulant cannot reach the package substrate 115. Consequently, there is insufficient capillary force to drive the CUF encapsulant flow into the underfill region 113 such that the CUF encapsulant stops at the die-to-die gap.

Figure 4:
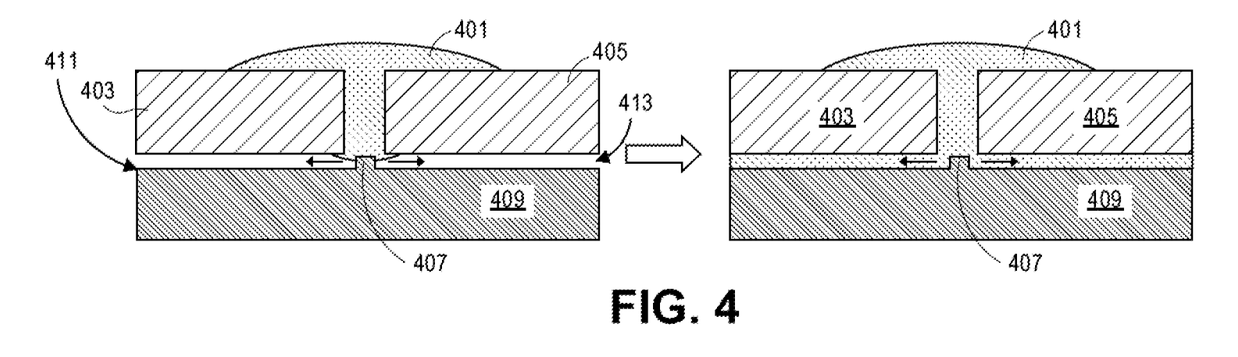
FIG. 4 is an illustration of a cross-sectional view of a substrate with a CUF contact protrusion to facilitate CUF contact with a substrate in accordance with an embodiment of the present disclosure.

FIG. 4 is an illustration of a cross-sectional view of a substrate with a CUF contact protrusion to facilitate CUF encapsulant contact with the substrate according to an embodiment. It should be appreciated that CUF encapsulant contact with the substrate is important to encapsulating the underfill region of adjacent dies with a narrow die-to-die gap. In an embodiment, the CUF contact protrusions facilitate CUF encapsulant contact with the substrate in order to effect a successful underfill. In an embodiment, the CUF contact protrusions can be speed bump like structures that are formed on the substrate (either organic substrate or Si wafer) to facilitate the contact of the CUF encapsulant with the package substrate. FIG. 4 shows CUF encapsulant 401, first die 403, second die 405, CUF contact protrusion 407 and package substrate 409. In FIG. 4, at 400 the CUF encapsulant 401 makes contact with the CUF contact protrusion 407. It should be appreciated that contact is made with the CUF contact protrusion 407 although in the example of FIG. 4, the CUF flow on the back side surfaces of the first die 403 and the second die 405 is the dominant flow direction. Moreover, the CUF encapsulant flow in the die-to-die gap between the first die 403 and the second die 405 is correspondingly slow, which as discussed above, causes a low contact angle of the CUF encapsulant on the back side surfaces of the first die 403 and the second die 405. However, even though R1 and R2 are both small, and the CUF encapsulant 401 does not reach the main substrate surface 411, contact is made with the CUF contact protrusion 407. The contact that the CUF encapsulant 401 makes with the CUF contact protrusion 407 generates a capillary force that drives the CUF encapsulant flow into the underfill region 413 such that the underfill region 413 is filled. In this manner, the bottom sides of the first die 403 and the second die 405 are encapsulated and the underfill process is successfully completed. FIG. 4 illustrates that in an embodiment, using CUF contact protrusions 407, the CUF encapsulant can more readily make contact with the package substrate 409. Facilitating this contact enables the successful encapsulation of the underfill region 413 of first and second adjacently positioned dies that have a narrow die-to-die gap.

In an embodiment, the CUF dispense of encapsulant between adjacent dies with a die-to-die gap as narrow as 100 um is enabled. Additionally, embodiments enable CUF dispense between adjacent dies on complicated multichip packages, with minimal need for materials development and additional equipment requirements.

Figure 5:
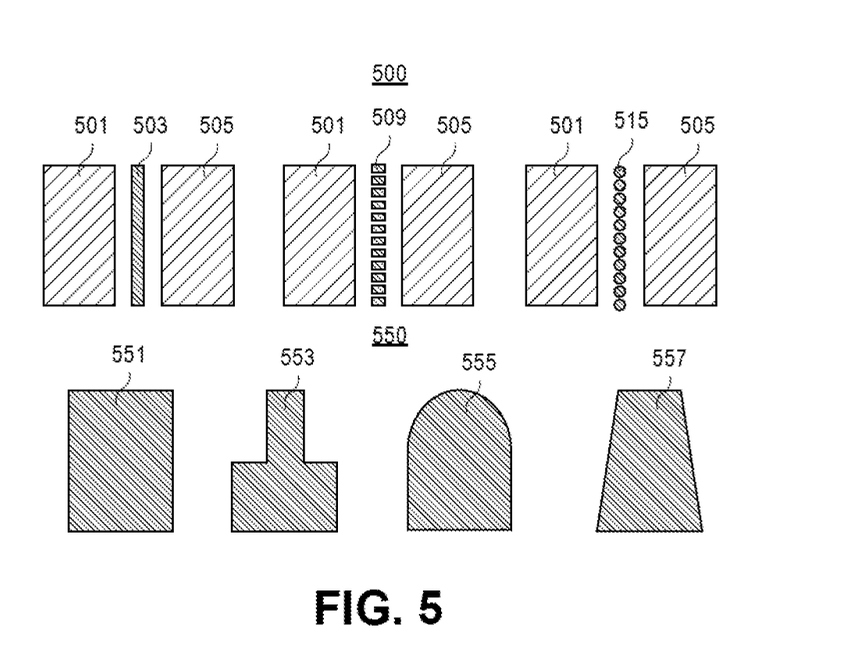
FIG. 5 is an illustration of cross-sectional views of example substrate contact protrusion layout schemes and substrate contact protrusion geometries in accordance with an embodiment of the present disclosure.

FIG. 5 is an illustration of cross-sectional views of example substrate contact protrusion layout schemes and substrate contact protrusion geometries according to an embodiment. In FIG. 5, example substrate contact protrusion layout schemes are shown at 500 and example substrate contact protrusion geometries are shown at 550. Referring to FIG. 5, at 500, example contact protrusion layout schemes include first die 501 and second die 505 and contact protrusion layout patterns 503, 509 and 515. The contact protrusion layout pattern 503 has a monolithic structure that lies underneath, and extends parallel to the space between the first die 501 and the second die 505. The contact protrusion layout pattern 509 includes a plurality of individual protrusions that lie underneath, and extend parallel to the space between the first die 501 and the second die 505. The individual protrusions of contact protrusion layout pattern 509 have a rectangular top view cross sectional profile. The contact protrusion layout pattern 515 includes a plurality of individual protrusions that lie underneath, and extend parallel to, the space between the first die 501 and the second die 505. The individual protrusions of the contact protrusion layout pattern 515 have a circular cross sectional top view profile. Referring again to FIG. 5, at 550, the example substrate contact protrusion geometries include front view cross-sectional profiles that are rectangular 551, stacked (rectangular) 553, hemispheric 555 and trapezoidal 557. It should be appreciated that the substrate contact protrusion layout schemes and substrate contact protrusion geometries described with reference to FIG. 5 are exemplary and that any other suitable substrate contact protrusion layout schemes and substrate contact protrusion geometries can be used in accordance with embodiments of the present disclosure.

In an embodiment, the length of a protrusion can be determined by the CUF dispense length and the die size. For example, in an embodiment, the minimum length of the protrusion can be determined to be similar to the CUF dispense length and the maximum length of the protrusion can be determined to be the same or slightly larger than the die size. In an embodiment, the height of the substrate contact protrusions can be lower than the chip gap height, and the width of the substrate contact protrusions can allow a minimum distance of approximately 20 um from the Si die corner/sidewall for the flow of CUF encapsulant. In other embodiments the substrate contact protrusions can have other heights and can have other widths.

In an embodiment, the position of a substrate contact protrusion can be on the substrate and aligned to the middle of the die-to-die gap. In other embodiments, the position of a substrate contact protrusion can be to the left or the right of the middle of the die-to-die gap. In an embodiment, a substrate contact protrusion can be positioned anywhere that is suitable for facilitating CUF encapsulant contact with the substrate.

In an embodiment, the material makeup of a substrate contact protrusion can be the same as the substrate material or can be a combination of the substrate material and another material or materials. In an embodiment, the material makeup of the substrate contact protrusion can include but is not limited to solder resist or buildup layer in the case of an organic substrate, and silicon, silicon oxide, silicon nitride and/or metals in the case of a silicon substrate. In other embodiments, still other materials that are suitable for forming a substrate contact protrusion can be used to form a protrusion.

Figure 6:
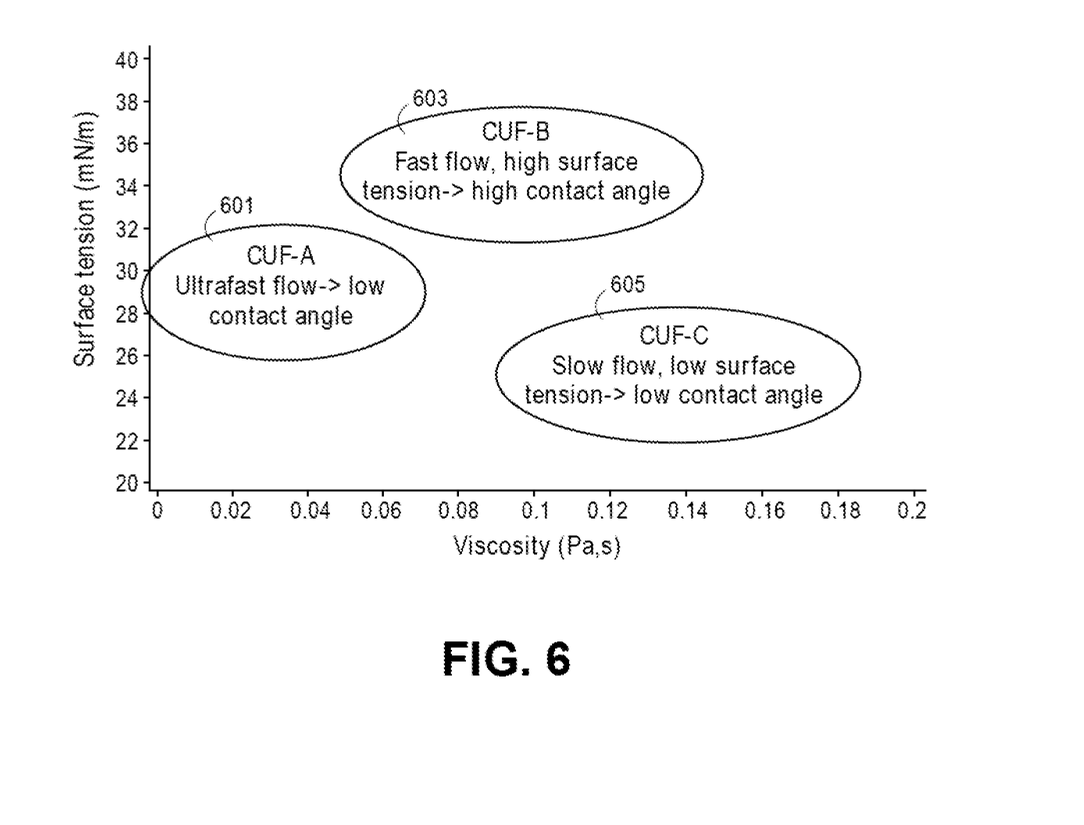
FIG. 6 shows a graph of viscosity versus surface tension for various materials in accordance with an embodiment of the present disclosure.

FIG. 6 shows a graph of viscosity versus surface tension for various materials and the impact of viscosity and surface tension on flow characteristics in the die-to-die dispense process. FIG. 6 shows viscosity versus surface tension for CUF materials CUF A 601, CUF B 603 and CUF C 605. In an embodiment, of the materials CUF A 601, CUF B 603 and CUF C 605, CUF A 601 has the lowest viscosity and the intermediate surface tension, CUF B 603 has the intermediate viscosity and the highest surface tension and CUF C 605 has the highest viscosity and the lowest surface tension. In an embodiment, improvements to die-to-die dispense process margin can be made by maintaining CUF viscosity and surface tension in a range such that a suitable contact angle is achieved. FIG. 6 shows that surface tension and viscosity are modulators for contact angle and consequently the flow between die-to-die gaps. In an embodiment, CUF should have high surface energy (greater than 34 mN/m) and fast flow into die-to-die gaps (approximately 0.8 Pa·s viscosity) to achieve a high contact angle. In other embodiments, CUF can have other surface energies and flow characteristics to achieve a high contact angle. It should be appreciated that lower surface energy on the Si die backside can lead to a higher CUF contact angle. In addition, in an embodiment, hydrophobic coating on the Si die backside can be used to accelerate the die-to-die flow.

Figure 7:
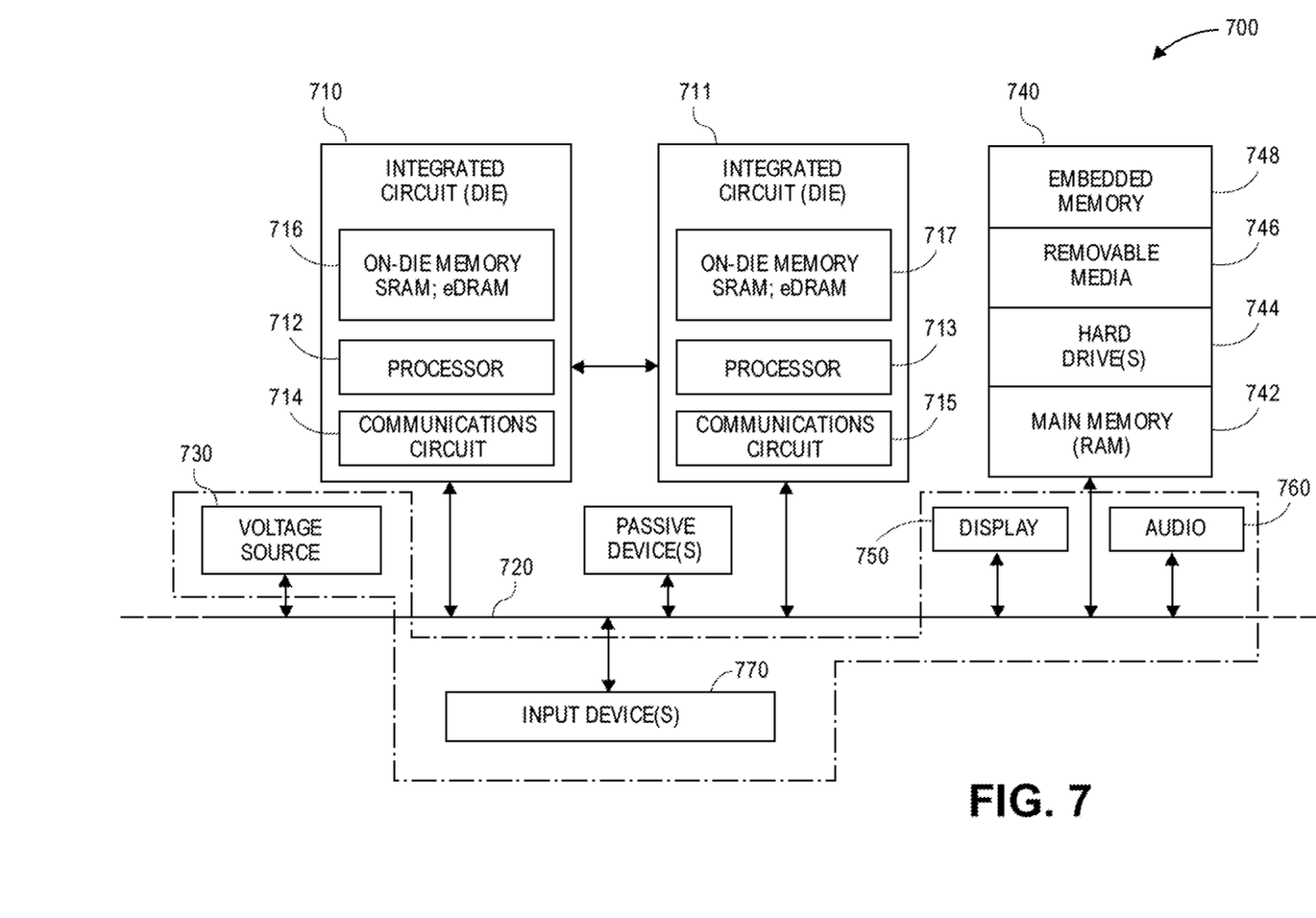
FIG. 7 is a schematic of a computer system in accordance with an embodiment of the present disclosure.

FIG. 7 is a schematic of a computer system 700, in accordance with an embodiment of the present disclosure. The computer system 700 (also referred to as the electronic system 700) as depicted can embody a semiconductor package that includes a substrate protrusion for causing underfill material to fill space underneath a first die and a second die, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a package that includes a substrate protrusion for causing underfill material to fill space underneath a first die and a second die, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having a substrate protrusion for causing underfill material to fill space underneath a first die and a second die, according to any of the several disclosed embodiments and their equivalents, an electronic system, a computer system, one or more methods of fabricating an integrated circuit, and one or more methods of fabricating an electronic assembly that includes a package substrate having a substrate protrusion for causing underfill material to fill space underneath a first die and a second die, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a substrate protrusion for causing underfill material to fill space underneath a first die and a second die embodiments and their equivalents. A foundation substrate may be included, as represented by the dashed line of FIG. 7. Passive devices may also be included, as is also depicted in FIG. 7.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

The following examples pertain to further embodiments. The various features of the different embodiments may be variously combined with some features included and others excluded to suit a variety of different applications.

Example embodiment 1: A substrate protrusion comprises a top portion extending in a first direction toward a gap between a first die and a second die and in a second direction parallel to the gap between the first die and the second die. A base portion is coupled to a substrate that extends underneath the first die and the second die.

Example embodiment 2: The substrate protrusion of embodiment 1 wherein the substrate protrusion is located between the first die and the second die.

Example embodiment 3: The substrate protrusion of embodiment 1 wherein a back side of the first die and the second die is coated with hydrophobic material.

Example embodiment 4: The substrate protrusion of embodiment 1 wherein the substrate protrusion is monolithic.

Example embodiment 5: The substrate protrusion of embodiment 1, 2, 3 or 4 wherein the substrate protrusion comprises a plurality of discrete parts.

Example embodiment 6: The substrate protrusion of embodiment 1 wherein the substrate protrusion has a rectangular shape.

Example embodiment 7: The substrate protrusion of embodiment 1 wherein the substrate protrusion has a hemispheric top surface.

Example embodiment 8: The substrate protrusion of embodiment 1, 2, 3, 4, 5, 6, or 7 wherein the substrate protrusion has a trapezoidal shape.

Example embodiment 9: A substrate comprising a protrusion extending in a first direction toward a gap between a first die and a second die and in a second direction parallel to the gap between the first die and the second die. The substrate includes a first portion coupled to the protrusion and extending beneath the first die and a second portion coupled to the protrusion and extending beneath the second die.

Example embodiment 10: The substrate of embodiment 9 wherein the protrusion extends from a top surface of the substrate.

Example embodiment 11: The substrate of embodiment 9 wherein the protrusion is located between the first die and the second die.

Example embodiment 12: The substrate of embodiment 9, 10, or 11 wherein a back side of the first die and the second die is coated with hydrophobic material.

Example embodiment 13: The substrate of embodiment 9 wherein the protrusion is monolithic.

Example embodiment 14: The substrate of embodiment 9 wherein the protrusion comprises a plurality of discrete parts.

Example embodiment 15: The substrate of embodiment 9 wherein the protrusion has a rectangular shape.

Example embodiment 16: The substrate of embodiment 9, 10, 11, 12, 13, 14, or 15 wherein the protrusion has a hemispheric top surface.

Example embodiment 17: The substrate of embodiment 9, 10, 11, 12, 13, 14, or 15 wherein the protrusion has a trapezoidal shape.

Example embodiment 18: A method of providing underfill between a narrow die-to-die gap, comprising dispensing underfill material toward a gap between adjacent dies. The method includes causing the underfill material to contact a protrusion that extends from a substrate toward the gap. The underfill material is caused to fill the space underneath the adjacent dies based on the contact with the protrusion.

Example embodiment 19: The method of embodiment 18 wherein the causing the underfill material to contact a protrusion that extends from a substrate toward the gap comprises causing the underfill material to contact a protrusion that is located between the die-to-die gap.

Example embodiment 20: The method of embodiment 18 or 19 further comprising forming a hydrophobic coating on a backside of the adjacent dies.

What is claimed is:

1. A package, comprising:
   a substrate comprising a protrusion, the protrusion having a first sidewall and a second sidewall, the second sidewall laterally opposite the first sidewall, and the protrusion having a lateral width between the first sidewall and the second sidewall;
   a first die coupled to the substrate;
   a second die coupled to the substrate, the protrusion between the first die and the second die, wherein the second die is laterally spaced apart from the first die by a lateral distance greater than the lateral width of the protrusion; and
   an encapsulant over the protrusion of the substrate, the encapsulant extending beneath the first die, and the encapsulant extending beneath the second die.

2. The package of claim 1, wherein the protrusion extends from a top surface of the substrate.

3. The package of claim 1, wherein a back side of the first die and a back side of the second die are coated with hydrophobic material.

4. The package of claim 1, wherein the protrusion is monolithic.

5. The package of claim 1, wherein the protrusion comprises a plurality of discrete parts.

6. The package of claim 1, wherein the protrusion has a rectangular shape.

7. The package of claim 1, wherein the protrusion has a hemispheric top surface.

8. The package of claim 1, wherein the protrusion has a trapezoidal shape.

9. A method, comprising:
   dispensing underfill material toward a protrusion between adjacent dies, wherein the protrusion extends from a substrate, the protrusion having a first sidewall and a second sidewall, the second sidewall laterally opposite the first sidewall, and the protrusion having a lateral width between the first sidewall and the second sidewall, wherein the adjacent dies are laterally spaced apart from one another by a lateral distance greater than the lateral width of the protrusion;
   causing the underfill material to contact the protrusion; and
   causing the underfill material to fill space underneath the adjacent dies based on the contact with the protrusion.

10. The method of claim 9, wherein the causing the underfill material to contact the protrusion comprises causing the underfill material to contact the protrusion between a die-to-die gap.

11. The method of claim 9, further comprising forming a hydrophobic coating on a backside of the adjacent dies.

12. A method of fabricating a package, the method comprising:
   forming a substrate comprising a protrusion, the protrusion having a first sidewall and a second sidewall, the second sidewall laterally opposite the first sidewall, and the protrusion having a lateral width between the first sidewall and the second sidewall;
   coupling a first die to the substrate;

coupling a second die to the substrate, the protrusion between the first die and the second die, wherein the second die is laterally spaced apart from the first die by a lateral distance greater than the lateral width of the protrusion; and forming an encapsulant over the protrusion of the substrate, the encapsulant extending beneath the first die, and the encapsulant extending beneath the second die.

13. The method of claim 12, wherein the protrusion extends from a top surface of the substrate.

14. The method of claim 12, wherein a back side of the first die and a back side of the second die are coated with hydrophobic material.

15. The method of claim 12, wherein the protrusion is monolithic.

16. The method of claim 12, wherein the protrusion comprises a plurality of discrete parts.

17. The method of claim 12, wherein the protrusion has a rectangular shape.

18. The method of claim 12, wherein the protrusion has a hemispheric top surface.

19. The method of claim 12, wherein the protrusion has a trapezoidal shape.

* * * * *